(12) United States Patent
Wagenleitner et al.

(10) Patent No.: US 11,282,706 B2
(45) Date of Patent: *Mar. 22, 2022

(54) DEVICE AND METHOD FOR BONDING OF SUBSTRATES

(71) Applicant: EV Group E. Thallner GmbH, St. Florian am Inn (AT)

(72) Inventors: Thomas Wagenleitner, Aurolzmunster (AT); Thomas Plach, Stadl-Paura (AT); Jurgen Markus Suss, Rainbach (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/386,580

(22) Filed: Apr. 17, 2019

(65) Prior Publication Data

US 2019/0244816 A1 Aug. 8, 2019

Related U.S. Application Data

(63) Continuation of application No. 16/080,156, filed as application No. PCT/EP2016/056249 on Mar. 22, 2016.

(51) Int. Cl.
*H01L 21/20* (2006.01)
*H01L 21/67* (2006.01)
(Continued)

(52) U.S. Cl.
CPC .... *H01L 21/2007* (2013.01); *H01L 21/67092* (2013.01); *H01L 21/67288* (2013.01); *H01L 21/6838* (2013.01); *H01L 23/32* (2013.01)

(58) Field of Classification Search
CPC ............... H01L 21/187; H01L 21/2007; H01L 21/6875; H01L 23/32; H01L 21/67288;
(Continued)

(56) References Cited

U.S. PATENT DOCUMENTS 6,214,692 B1 4/2001 Thallner
6,778,377 B2 8/2004 Hagi
(Continued)

FOREIGN PATENT DOCUMENTS

CN 105374725 8/2015
EP 2655006 B1 10/2013
(Continued)

OTHER PUBLICATIONS

International Search Report from corresponding International Patent Application No. PCT/EP2016/056249, dated Dec. 8, 2016.

*Primary Examiner* — Shahed Ahmed
*Assistant Examiner* — Sun Mi Kim King
(74) *Attorney, Agent, or Firm* — Kusner & Jaffe (57) ABSTRACT

A method and a corresponding device for bonding a first substrate with a second substrate at mutually facing contact faces of the substrates. The method includes holding of the first substrate to a first holding surface of a first holding device and holding of the second substrate to a second holding surface of a second holding device. A change in curvature of the contact face of the first substrate and/or a change in curvature of the contact face of the second substrate are controlled during the bonding.

27 Claims, 7 Drawing Sheets

(51) Int. Cl.
*H01L 21/683* (2006.01)
*H01L 23/32* (2006.01)

(58) Field of Classification Search
CPC ........... H01L 21/6838; H01L 21/67259; H01L 21/185; H01L 21/76251; H01L 2224/808; H01L 2224/80894; H01L 2224/818; H01L 2224/838; H01L 2224/83896
See application file for complete search history.

(56) References Cited

U.S. PATENT DOCUMENTS

| | | | |
|---|---|---|---|
| 7,682,933 | B1 | 3/2010 | Loomis |
| 8,147,630 | B2 | 4/2012 | George |
| 8,580,654 | B2 * | 11/2013 | Kerdiles ........... H01L 21/67132 438/455 |
| 8,851,133 | B2 * | 10/2014 | Liu .................... H01L 21/6838 156/358 |
| 9,061,388 | B2 | 6/2015 | Tiefenböck |
| 9,312,161 | B2 | 4/2016 | Wimplinger et al. |
| 9,613,840 | B2 | 4/2017 | Wagenleitner |
| 9,694,572 | B2 | 7/2017 | Sugihara et al. |
| 9,837,291 | B2 | 12/2017 | Huang et al. |
| 2008/0165330 | A1* | 7/2008 | Mizutani ............. H01L 21/6838 355/30 |
| 2010/0122762 | A1* | 5/2010 | George ................. H01L 21/187 156/64 |
| 2012/0193009 | A1 | 8/2012 | Fujii |
| 2012/0329241 | A1 | 12/2012 | Yamaguchi et al. |
| 2015/0357226 | A1 | 12/2015 | Liu et al. |

FOREIGN PATENT DOCUMENTS

| | | |
|---|---|---|
| EP | 2656378 B1 | 10/2013 |
| JP | 07-066093 A | 3/1995 |
| JP | 10-022184 A | 1/1998 |
| JP | 2002009140 | 1/2002 |
| JP | 2009-10072 A | 1/2009 |
| JP | 2012-156163 A | 8/2012 |
| JP | 2012-175043 A | 9/2012 |
| JP | 2011-216832 A5 | 7/2013 |
| JP | 2014-529885 A | 11/2014 |
| JP | 2015-119088 A | 6/2015 |
| JP | 2015119088 | 6/2015 |
| JP | 2015120801 | 7/2015 |
| JP | 2006-270084 A | 10/2016 |
| JP | 2017005219 | 1/2017 |
| JP | 2017-118066 A | 6/2017 |
| JP | 6448848 B2 | 12/2018 |
| KR | 10-2011-0089334 A | 8/2011 |
| KR | 10-2015-0055551 A | 5/2015 |
| KR | 10-2015-0088691 A | 8/2015 |
| WO | WO 2010/057068 A2 | 5/2010 |
| WO | WO 2014/191033 A1 | 12/2014 |
| WO | WO 2014/202106 A1 | 12/2014 |
| WO | WO 2015/082020 A1 | 6/2015 |
| WO | WO2017015502 A8 | 3/2017 |
| WO | WO 2017/155002 A1 | 9/2017 |

* cited by examiner

DEVICE AND METHOD FOR BONDING OF SUBSTRATES

RELATED APPLICATIONS

The present application is a continuation of U.S. application Ser. No. 16/080,156, filed Aug. 27, 2018, which is a U.S. National Stage Application of International Application No. PCT/EP2016/056249, filed Mar. 22, 2016, said patent applications hereby fully incorporated herein by reference.

FIELD OF THE INVENTION

The invention relates to a method for bonding a first substrate with a second substrate and a corresponding device.

BACKGROUND OF THE INVENTION

Substrates have been joined together by so-called bonding processes for many years in the semiconductor industry. Before the joining, these substrates must be aligned with one another as accurately as possible, wherein divergences in the nanometre range occurring in the meantime play a part. The alignment of the substrates usually takes place by means of alignment marks. Apart from the alignment marks, other, in particular functional elements are also present on the substrates, which also have to be aligned with one another during the bonding process. This alignment accuracy between the individual functional elements is required for the entire substrate surface. Thus, for example, it is not sufficient for the alignment accuracy to be very good in the centre of the substrates, but to diminish towards the edge.

In the prior art, there are a number of methods and systems, with the aid of which an attempt can be made to exert an influence on the bonding process, such as for example described in publications EP2656378B1 or WO2014191033A1.

One of the greatest challenges in bonding is in the bonding process itself, i.e. during the bond initiation up to the complete contacting of the contact faces of the substrates. The alignment of the two substrates with respect to one another can still change decisively here compared to the previous alignment. If the two substrate surfaces are first joined together, a separation is theoretically again possible, but is associated with high costs, low throughput and susceptibility to errors.

SUMMARY OF THE INVENTION

The problem addressed by the present invention is to provide a device and a method for bonding two substrates, with which the bonding accuracy, in particular at the edge of the substrates, is increased.

The present problem is solved with the features of the independent claim(s). Advantageous developments of the invention are given in the sub-claims. All combinations of at least two features given in the description, in the claims and/or the drawings also fall within the scope of the invention. In stated value ranges, values lying inside the stated limits are also deemed to be disclosed as limiting values and can be claimed in any combination.

The idea underlying the invention is that both substrates are curved before the contacting or bonding, and the curvature of at least one of the two substrates is changed by controlling the curvature during the bonding, in particular during the course of a bonding wave, preferably in fusion bonding. The curvature of the other (preferably upper) substrate is preferably also changed in a controlled manner.

The curvature also changes through automatic contacting of the substrates. The automatic contacting takes place in particular through the force of gravity acting on the substrate and/or other forces of attraction between the substrates. The control of the change in curvature of the one (in particular lower) substrate takes place in particular in a similar way to the change in curvature of the other (in particular upper) substrate, preferably as a function (preferably by measurement and control) of its change in curvature.

Change in curvature is understood in particular to mean a state diverging from an initial state (in particular the curvature adjusted before the contacting) of the substrates. According to the invention, the bonding is controlled after contacting of the contact faces, in particular by a monitored control of a fixing of the substrates. Corresponding fixing means are in particular provided according to the device.

A further, in particular independent, aspect of the present invention comprises the use of, in particular individually switchable, fixing elements, with the aid of which an advancing bonding wave between the contact faces can be controlled or regulated in a monitored manner.

A further, in particular independent idea according to the invention, or one that can be combined with the aforementioned idea, comprises the use of a deformation element as a curvature means and/or curvature changing means, which is constituted in particular as a gas outlet opening. Mechanical contact with the substrate is thus avoided. The monitoring of the curvature takes place more precisely by a combination of the aforementioned features.

The invention in particular describes a method and a device, with the aid of which two substrates aligned with one another can be bonded together in the optimum manner. The idea is primarily based on the notion of monitoring, controlling or regulating the advancing bonding wave by targeted monitoring, control or regulation of the curvature, fixing and/or release of at least one of the two substrates, in such a way that there is an optimum, sequential contacting of the two substrates along the contact faces, particularly progressing from the inside outwards. Optimum contacting is understood in particular to mean that the "run-out" error at every point of the contact interface between the two substrates is minimal or, in the optimum case, even disappears.

According to an embodiment, a fixing of the substrates is provided by a plurality of fixing elements, in particular divided up into zones.

According to a further embodiment, the curvature of at least one of the substrates is provided by means of excess pressure.

In the initial state, the substrates, especially at a contact face, are usually more or less flat, apart from any structures projecting above the contact face (microchips, functional components) and substrate tolerances such as bending and/or thickness variations. In the initial state, however, the substrates in most cases have a curvature differing from zero. For a 300 mm wafer, curvatures of less than 100 μm are common. From the mathematical standpoint, a curvature can be regarded as a measure of the local deviation of a curve from its plane state. In the specific case, substrates are considered whose thicknesses are small compared to the diameter. To a good approximation, therefore, one can speak of the curvature of a plane. In the case of a plane, the initially mentioned plane state is the tangential plane of the curve at the point at which the curvature is observed. Generally speaking, a body, in the special case the substrate, does not have a homogeneous curvature, so that the curvature is an explicit function of the location. Thus, it may for example be the case that a non-plane substrate has a concave curvature in the centre, but a convex curvature at other points. According to the invention, curvature or change in curvature—unless described otherwise—is understood to mean a macroscopic curvature or change in curvature, i.e. related to the entire substrate or the contact face.

According to the invention, convex curvatures are preferred, in each case as viewed from the opposite substrate. Still more preferably, the curvatures of the two substrates run mirror-inverted with respect to one another.

Another possible way of indicating the curvature of at a point comprises indicating a radius of curvature. The radius of curvature is the radius of a circle adapted to the shape of the surface and containing the surface point in question.

An, in particular, independent core idea for most of the embodiments according to the invention thus includes the fact that the radii of curvature of the two substrates to be bonded together are the same, or at least diverge only marginally from one another, at least in the contacting region of the substrates, i.e. at a bonding front of the bonding wave or at the bonding line. The difference between the two radii of curvature at the bonding front/bonding line of the substrates is less than 10 m, preferably less than 1 m, more preferably less than 1 cm, most preferably less than 1 mm, with utmost preference less than 0.01 mm, most preferably of all less than 1 µm. Generally speaking, all embodiments according to the invention that minimise the difference between radii of curvature R1, R2 are advantageous.

In other words: The invention relates in particular to a method and a system with the aid of which it is made possible to bond two substrates together in such a way that their local alignment errors, which are referred to as "run-out" errors, are minimal. The different run-out errors are described and referenced comprehensively in WO2014191033A1. The description of the run-out error in WO2014191033A1 is hereby explicitly adopted in the disclosure content of this description. Its precise description will therefore be dispensed with here.

The invention continues to be based in particular on the idea of controlling the curvatures/curvature changes of the two substrates to be bonded together in particular by a fixing that is controllable in particular over wide area segments, in such a way that the influencing factors on the forming bonding wave are selected such that the two substrates do not shift locally, i.e. remain correctly aligned, with respect to one another during the bonding. Furthermore, the invention describes an article, comprising two substrates to be bonded together with a "run-out" error reduced according to the invention.

A characteristic method according to the invention during bonding, in particular permanent bonding, preferably fusion bonding, is the most concentric and/or punctiform possible contacting of the two contact faces of the substrates. Generally speaking, the contacting of the two substrates can also take place in a non-concentric manner. The bonding wave being propagated from a non-concentric contact point would reach different points of the substrate edge at different times. The complete mathematical-physical description of the bonding wave behaviour and of the resultant "run-out" error compensation would be correspondingly complicated. The contacting point will preferably not lie far from the centre of the substrate, so that the effects possibly resulting therefrom, in particular at the edge of the substrates, are negligible. According to the invention, the distance between a possible non-concentric contacting point and the centre of the substrate is in particular less than 100 mm, preferably less than 10 mm, more preferably less than 1 mm, most preferably less than 0.1 mm, with utmost preference less than 0.01 mm. In the rest of the description, contacting should as a rule be understood to mean concentric contacting. In the broader sense, centre is preferably understood to mean the geometrical centre-point of a basic ideal body, if necessary compensated for asymmetries. In the case of wafers standard in the industry with a notch, the centre is therefore the circle centre-point of the circle that surrounds the ideal wafer without a notch. In the case of wafers standard in the industry with a flat (flattened side), the centre is the circle centre-point of the circle that surrounds the ideal wafer without the flat. Similar considerations apply to arbitrarily shaped substrates. In specific embodiments, it may however be useful for the centre to be understood as the centre of gravity of the substrate.

According to an embodiment of the invention, an in particular upper holding device (substrate holder), provided with a central hole and a pin movable in a translational manner therein as a curvature means and/or curvature changing means, is provided in particular with a radially symmetrical fixing as a fixing means, in order to ensure an exact, concentric, punctiform contacting. The use of a nozzle as a curvature means and/or curvature changing means, which uses a fluid, preferably a gas, instead of the pin for the in particular direct fluid pressurisation of the substrate (fluid pressurisation means), would also be conceivable. Furthermore, the use of such elements can even be completely dispensed with, if devices are provided which can cause the two substrates to approach one another by a translational movement, with the further provision that both substrates have an impressed curvature in the direction of the other substrate, in particular by reason of gravitation and/or pre-tensioning. The substrates automatically make contact during the translational approach, with a sufficiently small spacing with respect to the corresponding second substrate.

According to an embodiment of the invention, the fixing elements are provided vacuum holes, one or more circular vacuum lips or comparable vacuum elements, with the aid of which the wafer can be fixed. The use of a plurality of electrostatic fixing elements (fixing means) is also conceivable. The pin in the central hole or a line from which an excess pressure can be generated between the substrate holder and the substrate by an introduced gas are used for the controllable deflection of the fixed substrate (curvature means and/or curvature changing means).

After the contacting of the centres of the two substrates has taken place, the fixing means of the holding devices are in particular controlled in such a way that a monitored deformation/curvature change of at least one of the substrates takes place. An upper substrate is pulled down in a controlled manner on the one hand due to the force of gravity and on the other hand due to a bonding force acting along the bonding wave and between the substrates. The upper substrate is thus joined with the lower substrate radially from the centre to the side edge. A formation of a radially symmetrical bonding wave according to the invention thus arises, which runs in particular from the centre to the side edge. During the bonding process, the two substrates press the gas, in particular air, present between the substrates ahead of the bonding wave and thus ensure a bonding interface without gas inclusions. The upper substrate then lies, insofar as it has been allowed to drop completely, virtually on a kind of gas cushion. From a defined point in time, all the fixing elements of the substrate holder can be switched off, so that the upper substrate is left to itself under the influence of the force of gravity and/or the forces of attraction between the substrates. At this time, the change in curvature of the upper substrate is no longer controlled or regulated, but continues to proceed in a monitored manner, since the boundary conditions are known or have been determined empirically. The change in curvature of the lower substrate is controlled and regulated on the basis of this monitored change in curvature and advancing of the bonding wave. The embodiment preferred according to the invention does not however comprise the complete dropping of the upper substrate, but rather in a complete monitoring of the two substrates until the bonding wave has propagated at least over more than 10%, preferably more than 20%, more preferably more than 30%, most preferably more than 50%, with ultimate preference more than 75% of the area of the substrate.

From the aforementioned point in time, at which all the fixing elements of the upper holding device have been switched off, no additional fixing is in particular required. Apart from the fixing at the bond initiation, the upper substrate can thus move freely and also become distorted. As a result of the bonding wave advancing according to the invention, the stress states arising at the bonding wave front and the prevailing geometrical boundary conditions, each circle segment, infinitesimally small compared to its radial thickness, is subject to a distortion. However, since the substrates represent rigid bodies, the distortions add up as a function of the distance from the centre. This leads to "run-out" errors, which are intended to be eliminated by the method according to the invention and the device according to the invention. It is also conceivable for the upper substrate to be held fixed during the entire time segment in which the bonding wave is running and for an advance of the bonding wave to be able to progress by successive switching-off of the fixing elements, in particular starting with the fixing elements inside the substrate holder. An advance of the bonding wave can in particular also be promoted by the fact that a relative approach of the two substrate holders with respect to one another takes place during the advance of the bonding wave.

The invention thus relates in particular to a method and a device for reducing or even completely preventing the "run-out" error between two bonded substrates during bonding, in particular by thermodynamic and/or mechanical compensation mechanisms.

Furthermore, the invention relates to a corresponding article, which is produced with the device according to the invention and the method according to the invention.

Holding Device/Substrate Holder

The substrate holder according to the invention comprises fixing means, in particular a plurality of fixing elements. The fixing elements can be divided into zones. A grouping of the fixing elements into zones performs either a geometrical, optical task, but preferably a functional task. A functional task is understood for example to mean that all the fixing elements of a zone can be switched simultaneously. It is also conceivable that all the fixing elements in a zone can be switched individually. A plurality of fixing elements can thus be triggered simultaneously within the zone for the fixing or the release of the substrate or they can be triggered individually, but they produce a very individual deformation property of the substrate in their zone.

The zones can in particular have the following geometries:
single-surface,
circle segment,
tiled, in particular as a triangle, rectangle or hexagon.

In particular, areas without fixing elements can also be present between the zones. The spacing between such zones is in particular less than 50 mm, preferably less than 25 mm, more preferably less than 20 mm, most preferably less than 10 mm, with utmost preference less than 5 mm. If the zones are configured as circle segments, the spacing would then be the distance between the inner circular ring of an outer circle segment and the outer circular ring of an inner circle segment.

The number of fixing elements per zone is arbitrary. In particular, at least 1 fixing element, preferably at least 2 fixing elements, preferably more than 10, more preferably more than 50, still more preferably more than 100, most preferably more than 200, with utmost preference more than 500 in a zone.

According to an advantageous embodiment of the invention, the first holding device and/or the second holding device comprise fixing means arranged in particular in a ring-shaped, preferably a circular ring-shaped manner at the periphery of holding surfaces of the first holding device and/or of the second holding device in order to hold the substrates, in particular solely in the region of side edges of the substrates.

The fixing means are constituted as in particular separately controllable fixing elements divided up into zones, arranged preferably concentrically, in particular distributed uniformly at the holding surfaces. The fixing means are preferably arranged, in particular exclusively, in an edge region of the holding surface. The edge region extends in particular up to half the radius, preferably up to a quarter of the radius, of the holding surface.

In a radially symmetrical arrangement of the fixing elements in a zone, the number of the fixing elements per cross-section can also be considered. The number of fixing elements in the cross-section is less than 20, preferably less than 10, more preferably less than 5, most preferably less than 3, with utmost preference 1.

The fixing elements can be subjected to an underpressure for the fixing, and can also be subjected to an excess pressure for the release of the substrate.

In a first embodiment according to the invention, the fixing elements comprise simple holes produced in particular by drilling or spark erosion. In a special embodiment, the fixing elements are ring-shaped, in particular circular ring-shaped slots produced in particular by a milling process. In a development, the fixing elements can be provided with vacuum lips. If the fixing elements are provided with vacuum elements, they can thus generate a pressure of less than 1 bar, preferably less than 0.1 mbar, still more preferably 0.01 mbar, most preferably less than 0.001 mbar, with utmost preference less than 0.0001 mbar.

In a second embodiment according to the invention, the fixing elements comprise conductive plates, which are used as an electrostatic fixing. The conductive plates can be connected unipolar, but preferably bipolar. In the case of a bipolar circuit, two plates are placed at reciprocal potential. The substrate holder according to the invention then acts in its zones as an electrostatic substrate holder with a highly resolved electrostatic fixing property dependent on the number of plates.

The greater the number of fixing elements per unit area, the better the control of the fixing property of the substrate holder for the substrate.

The first holding surface and/or the second holding surface are advantageously formed from elevations, forming in particular a first holding plane of the first holding surface and a second holding plane of the second holding surface.

According to two further embodiments, the holding devices with elevations, in particular stud substrate holders, are described. Such a substrate holder is understood to mean a substrate holder which comprises a plurality of, in particular symmetrically arranged, pillars. These pillars are in particular constituted as studs. The studs can have any shapes. In particular, studs are provided in the shape of:

pyramids, in particular three-sided or four-sided pyramids,
cylinders, in particular with a flat or rounded head,
cuboids,
cones,
spherical shells.

Spherical-shell studs, conical studs and cylindrical studs are expensive to produce, whereas pyramid-shaped or cuboid studs can be produced relatively simply by etching and/or milling processes and are therefore preferred according to the invention.

The mentioned stud substrate sample holders can be terminated at their periphery by an edge element, so that the edge regions between the studs can be interpreted as recesses. It is however also possible for the studs to represent the individual elevations with respect to the stud plane, on which all the studs are present.

In a third preferred embodiment according to the invention, the substrate holder is constituted as a stud substrate holder with webs. The individual zones are interrupted here by webs. At least one line ends inside each zone, which line permits an evacuation of the space between the studs. As a result of the use of a plurality of, in particular individually controllable, channels, a locally dependent evacuation of the space of differing intensity is possible.

In a fourth, still more preferred embodiment, the substrate holder is constituted as a complete stud substrate holder, i.e. without webs.

The width or diameter of the elevations, in particular studs, is in particular less than 5 mm, preferably less than 1 mm, still more preferably less than 500 μm, most preferably less than 200 μm.

The height of the elevations, in particular studs, is in particular less than 2 mm, preferably less than 1 mm, still more preferably less than 500 μm, most preferably less than 200 μm.

In particular, the ratio between the width or the diameter of the elevations and the height of the elevations is greater than 0.01, preferably greater than 1, still more preferably greater than 2, most preferably greater than 10, with utmost preference greater than 20.

All the stated embodiments according to the invention can also be combined arbitrarily with one another. Thus, it is conceivable for a first zone to comprise electrostatically operating fixing elements, and for a second zone to comprise vacuum fixings A substrate holder according to the invention can in particular comprise holes, referred to in the rest of the publication is measurement holes, which permit a view of the fixed substrate surface from the rear side of the substrate holder. A measurement of the fixed substrate surface in this region is thus enabled. The measurement holes can also be closed by means of a cover. In a very particularly preferred embodiment, the measurement holes can be fully automatically opened or closed with the cover.

According to an advantageous embodiment of the invention, the holding device comprises curvature measuring means for measuring the curvature.

Alternatively or in addition, a substrate holder according to the invention can comprise sensors, with the aid of which physical and/or chemical properties between the fixed substrate and the substrate sample holder can be measured. The sensors are preferably temperature sensors and/or
pressure sensors and/or
distance sensors.

The particularly preferred distance sensors can be used as curvature measuring means, in that the curvature of the substrate is determined from the distance between the substrate and the holding device, in particular interpreted and/or calculated between pillars.

According to the invention, distance sensors, in particular distributed along the holding surface, are preferably used in order to enable a better control or even regulation of the curvature and/or change in curvature.

In a particularly preferred embodiment, a plurality of sensors are primarily constituted as distance sensors in order to measure the distance of the substrate with respect to a plane before and/or during the bonding process. The plane is preferably the holding surface and/or the holding surface, in particular a plane formed through the elevations.

It is also conceivable for sensors to be located on different planes. The sensors preferably measure, in particular exclusively, the change in a distance, preferably normal to the contact face, so that the reference to a plane and/or a plurality of planes is irrelevant. In this case, only the relative, in particular locally different, change in distance of the substrate has to be detected.

The measurement of the distance is used primarily for the process control. Through the knowledge of the precise curvature state of the substrate/substrates, the control/regulation of the fixing elements according to the invention for the optimum, in particular gradual, release of the substrate takes place in a particularly efficient manner.

It is also conceivable for several different types of sensor to be incorporated. In a particularly preferred embodiment, sensors for distance and pressure measurement are incorporated in the substrate holder, in particular distributed symmetrically and uniformly. A discrete, but surface-covering distance measurement and pressure measurement is thus possible. The pressure measurement is particularly advantageous if the deformation element is a fluid, in particular a gas or gas mixture, introduced via a line.

Insofar as one or both holding devices are constituted without curvature measuring means and/or without sensors, the adjustment and/or control of the curvatures and or changes in curvature can take place on the basis of empirically determined parameters.

The first and second substrate holders according to the invention preferably comprise at least one, in particular concentrically designed, deformation element for the curvature/change in curvature of the substrates (curvature means and/or curvatures changing means).

According to a first embodiment according to the invention, the curvature element is a pin. This pin has at least one, preferably precisely one degree of freedom in translation along the normal to the holding surface or holding plane. It would also be conceivable for the pin to have degrees of freedom along the holding surface in order to be calibrated in the x- and/or y-direction. The pin can preferably be fixed in the x- and/or y-direction. The pin can apply a force of 0.01N-1000N, preferably 0.1N-500N, most preferably 0.25N-100N, with utmost preference between 0.5-10 N.

In a second embodiment according to the invention, the deformation element for the curvature/change in curvature is a fluid outlet opening, via which a fluid, in particular gas of gas mixture, can be fed between the substrate and the holding surface (fluid pressurisation means). In a very preferred embodiment according to the invention, the fluid outlet opening is incorporated in its own partial element, in particular mobile in the x- and/or y-direction, so that an x- and/or y-positioning of the fluid outlet opening can take place. The position of the fluid outlet is thus established exactly, which can also have effects on an optimum bonding result according to the invention. In the simplest case, the fluid outlet opening is an opening which represents the end of a line. In a very particularly preferred embodiment, the fluid outlet opening is a nozzle. The nozzle can preferably be controlled electronically, so that at any time the fluid pressure and/or the fluid speed of the outflowing fluid can be controlled/regulated. The use of a plurality of nozzles is conceivable in order to vary the pressure build-up at several points between the substrate sample holder and the substrate. All comments relating to a nozzle then apply equally to a plurality of nozzles. A pressure of more than 1 mbar, preferably more than 10 mbar, most preferably more than 100 mbar, still more preferably more than 200 mbar, with utmost preference more than 500 mbar can be built up between the substrate and the substrate holder via the fluid outlet opening, in particular a nozzle. All the substrate holders according to the invention can comprise loading pins. Loading pins are used to load the substrate holder according to the invention with a substrate. The loading pins are passed in particular through holes in the holding device, wherein the holes are preferably constituted sealed with respect to the loading pins.

The loading pins are extended in a first process step. A substrate is placed, in particular fully automatically, on the loading pins in a second process step. The loading pins are retracted and thus bring the substrate into a contact with the holding surface in a third process step. The substrate is fixed by means of the fixing elements in a fourth process step. The loading pins are also used for the unloading of a bonded substrate stack. The sequence of the process steps is then correspondingly reversed. The loading pins can in particular represent pressure sinks, insofar as they have not been sealed with respect to the holes in which they move. In this case, the static maintenance of an underpressure via vacuum fixing elements and/or the static maintenance of an excess pressure through a gas outlet opening is not possible. A continuous evacuation via the vacuum fixing elements and/or a continuous excess pressure generation via the gas outlet opening is accordingly disclosed, which is preferably characterised by a stationary, in particular laminar, flow. It is conceivable, however, also to make use of seals, so that a static pressure can be built up without the formation of a flow occurring.

The substrate holder can in principle be produced from any material. One or more of the following materials are particularly preferable:

metal, in particular
    pure metal, in particular
        aluminium
    alloy, in particular
        steel, in particular
            low-alloy steel,
ceramic, in particular
    glass ceramic, in particular
        Zerodur,
    nitride ceramic, in particular
        silicon nitride,
        carbide ceramic, in particular
            silicon carbide, -continued polymers, in particular
    high-temperature polymers, in particular
        Teflon,
            polyether ether ketone (PEEK).

In a very particularly preferred embodiment, a stud substrate sample holder according to the invention is produced using the method from patent specification EP2655006B1. The preferred material is silicon carbide or silicon nitride. The preferred stud structure in this case is a four-sided pyramid.

According to an embodiment according to the invention, the holding device is preferably constituted heatable and/or coolable. In this case, the temperature control mechanisms permit a temperature regulation of the substrate between −50° C. and 500° C., preferably between −25 C and 300° C., most preferably between 0° C. and 200° C., with utmost preference between 10° C. and 100° C.

In a further embodiment according to the invention, the substrate holder is constituted such that the substrate can be deformed, in particular laterally compressed or extended, in a targeted manner by heating and/or cooling means before the contacting, and more precisely by the amount that is required in the subsequent contacting to compensate in the best possible way, in the ideal case completely, for the occurring "run-out" error. Since the fixing of the lower/first substrate in this embodiment does not take place until after the corresponding deformation, no particular importance has to be placed on the thermal expansion coefficients of the lower/first substrate and the lower/first holding device. In the particularly preferred embodiment of a stud substrate holder according to the invention, the substrate can be brought into contact with a heated gas via the spatial regions between the studs. In order to maintain the fixing capability of the fixing elements, the pressure of the heated gas must be less than the ambient pressure, which presses the substrate onto the substrate holder in the region of the zones.

Bonder

A device according to the invention comprises two holding devices/substrate holders according to the invention. At least the upper substrate holder preferably comprises measurement holes. The measurement holes are constituted in particular closeable and/or sealed.

The embodiments according to the invention are preferably operated in a defined, in particular controllable, atmosphere, in particular under normal pressure.

All the mentioned embodiments according to the invention can, in a special variant of embodiment, be operated in a low vacuum, more preferably in a high vacuum, still more preferably in an ultrahigh vacuum, in particular at a pressure of less than 100 mbar, preferably less than 0.1 mbar, more preferably less than 0.001 mbar, still more preferably less than 10e-5 mbar, with utmost preference less than 10e-8 mbar. The higher the vacuum or the lower the pressure in the surroundings, the more difficult it will be however to fix a substrate with the aid of vacuum holes.

Processes

In a first process step according to the invention of a first process according to the invention, a first substrate is loaded onto a first substrate holder and a second substrate is loaded onto a second substrate holder and in particular fixed in a peripheral part.

In a second process step according to the invention of a first process according to the invention, the two substrates are aligned with one another. The alignment of the substrates is not described in detail here. In this regard, we refer to publications U.S. Pat. No. 6,214,692B1, WO2015082020A1, WO2014202106A1. Before the bonding process, the substrates are in particular aligned with one another in order to guarantee congruence (exact alignment, in particular with an accuracy of less than 2 µm, preferably less than 250 nm, still more preferably less than 150 nm, most preferably less than 100 nm, with utmost preference less than 50 nm) of corresponding structures on their surfaces.

In a third optional process step according to the invention of a first process according to the invention, the approach of the two substrates takes place by a relative movement of the two substrate holders towards one another. A well-defined gap is thus produced between the substrate surfaces. It is also conceivable for this gap to be adjusted before or during the alignment process. The gap amounts in particular to less than 1000 µm, preferably less than 500 µm, more preferably less than 250 µm, with utmost preference less than 100 µm.

According to the invention, it is particularly preferable if the radius of curvature of the two substrates, in particular at the bonding front, diverges the one from the other by less than 15%, preferably less than 10%, more preferably less than 5%, still more preferably less than 2%, with utmost preference is equal.

In a fourth process step according to the invention of a first process according to the invention, a curvature of the first and/or the second substrate takes place. At the same time, the curvature of the first and/or second substrate is measured and monitored with the aid of the sensors. In particular, a desired curvature at the lower and/or upper substrate can automatically be adjusted by means of a control loop. A setpoint value is preset. The control loop then controls the fixing elements and/or the deformation element until such time as the desired curvature profile has been adjusted. It should be mentioned that gravitation acts in one direction and can thus affect the deformation of the substrates differently. Whereas an upper fixed substrate is deformed by gravitation farther in the direction of the desired contact point, the gravitation of the curvature of the lower substrate counteracts this. The influence of gravitation may however also be negligible. As a result of the use according to the invention of automatically controlled or regulated curvature means or curvature changing means, fixing elements and sensors, the desired curvature profile can be adjusted for each of the two substrates, in particular as part of a control loop. Once the two substrates have approached one another sufficiently closely, the contacting of the two substrates takes place. The contacting can take place either by the constantly increasing curvature and/or by a relative approach of the two substrate holders towards one another. In the bonding method according to the invention, the substrates are not placed flat upon one another, but are first brought into contact with one another at centre M (bond initiation point), whereby one of the two curved substrates is pressed lightly against the second substrate or is correspondingly deformed in the direction of the substrate lying opposite. After release of the deformed (in the direction of the opposite substrate) deflected substrate, a continuous and more uniform, in particular at least partially, preferably predominantly automatic bonding, associated with the least possible force and therefore with the least possible, chiefly horizontal, distortions, takes place along the bonding front as a result of the advance of a bonding wave.

In a fifth process step according to the invention of a first process according to the invention, the advance, the monitoring and the control of the bonding wave takes place. Insofar as the bond initiation point is arranged in the centre of the contact faces of the substrates, a uniform in particular concentric course of the bonding wave can be produced.

It is particularly advantageous if the deformation, preferably curvature, of the first and/or second substrate and/or of the second substrate takes place in the lateral direction and/or in a convex and/or concave manner, still more preferably mirror-symmetrical. In other words, the deformation takes place according to the invention particularly by extension and/or compression and/or curvature of the first substrate and/or the second substrate.

The substrates preferably have approximately identical diameters D1, D2, which diverge from one another in particular by less than 5 mm, preferably less than 3 mm, still more preferably less than 1 mm.

According to a further, in particular independent, aspect of the invention, the deformation, preferably curvature, takes place by deformation means or curvature means and/or curvature changing means and/or by temperature control of the first and/or second holding devices.

The deformation/curvature/change in curvature according to the invention can be carried out more easily by the fact that the first substrate and/or the second substrate is fixed solely in the region of the periphery or the circumference of the first and/or second substrate holder or of the first and/or second substrates.

The control of the previously described steps and/or movements and/or sequences, in particular of the deformation means or curvature means and/or curvature changing means and/or fixing means, the approach of the substrates towards one another, the temperature, pressure and gas composition control, preferably takes place via a central control unit, in particular a computer with control software. The sensors described above are used for the control and/or regulation.

The substrates are preferably fixed at a circle segment lying as far outward as possible, in the region of the side edge, in order to provide the substrates with the greatest possible flexibility and freedom of expansion inside the fixing.

The first and/or second substrate is preferably radially symmetrical. Although the substrate can have any diameter, the substrate diameter is in particular 1 inch, 2 inches, 3 inches, 4 inches, 5 inches, 6 inches, 8 inches, 12 and inches, 18 inches or greater than 18 inches. The thickness of the first and/or second substrate lies between 1 µm and 2000 µm, preferably between 10 µm and 1500 µm, more preferably between 100 µm and 1000 µm.

In special embodiments, a substrate can also have a rectangular shape or a shape at least diverging from the circular shape. Wafers are preferably used as substrates.

Particularly preferably, all the variable parameters are selected such that the bonding wave propagates at the optimum possible speed with regard to the initial and boundary conditions. Particularly in the presence of atmosphere, in particular normal pressure, a speed of the bonding wave as slow as possible as advantageous. The average speed of the bonding wave is in particular less than 200 cm/s, more preferably less than 100 cm/s more preferably less than 50 cm/s, most preferably less than 10 cm/s, with utmost preference less than 1 cm/s. In particular, the speed of the bonding wave is greater than 0.1 cm/s. In particular, the speed of the bonding wave is constant along the bonding front. The speed of the bonding wave is automatically faster in a vacuum environment, since the substrates joining along the bonding line to not have to overcome any resistance due to a gas.

A further, in particular independent, aspect of the invention consists in contacting in as coordinated a manner as possible and at the same time virtually automatically, whereby at least one of the substrates is acted upon before the contacting by a preloading running radially outwards in particular concentric with respect to centre M of the contact face of the substrate and then only the beginning of the contacting is influenced, whereas after contacting of a section, in particular centre M of the substrate, the substrate is left free and automatically bonds with the opposite substrate in a controlled manner by reason of its preloading. The preloading is achieved by a deformation, in particular curvature, of the first substrate by deformation means, in particular curvature means and/or curvature changing means, wherein the deformation means, in particular by reason of its shape, acts on the side facing away from the bonding side and deformation can be correspondingly controlled by the use of different (in particular exchangeable) deformation means. The control also takes place through the pressure or the force with which deformation elements act on the substrate. It is advantageous to reduce the effective holding area of the substrate holder with the substrate, so that the substrate is supported only partially by the holding device. In this way, a smaller adhesion between the substrate and the substrate holder arises due to the smaller contact area. A fixing is applied according to the invention, in particular in the region of the periphery of the substrate, so that an effective fixing is provided with at the same time the smallest possible effective holding area between the holding contour of the substrate holder and the substrate. A careful and reliable release of the substrate is thus at the same time possible, since the release forces required for the release of the substrate are as small as possible. The release is in particular controllable, especially by reducing the underpressure at the holding surface. Controllable means that, after the contact of the substrate with a second substrate, the substrate still remains fixed to the sample holder and a release of the substrate (wafer) from the sample holder (holding device) is only brought about, in particular from the inside outwards, by a targeted (controlled) reduction of the underpressure at the holding surface. The effect of the embodiment according to the invention is in particular that the release can be brought about by very small forces. In particular, a plurality of different methods of release is disclosed.

- complete, sudden release of the substrate, while the deformation means is inactive,
- complete, sudden release of the substrate, while the deformation means is put spontaneously into its initial state and thus immediately ceases to act on the substrate,
- complete, sudden release of the substrate, while the deformation means ceases progressively, but continuously to act on the substrate,
- progressive release of the substrate, applied in particular zone by zone and preferably carried out from the inside outwards, by progressive switching-off of the fixings, while the deformation means is acting on the substrate,
- a combination of the stated methods The embodiment according to the invention discloses in its optimum form a bonding process, wherein the two substrates are curved. Generally speaking, however, at least one substrate may also not be deformed. The following table results in combination with the stated release mechanisms:

| Example # | Top deformed | Bottom deformed | Top release | Bottom Release |
|---|---|---|---|---|
| 1 | No | Yes | No | Yes |
| 2 | No | Yes | Yes | No |
| 3 | Yes | Yes | No | Yes |
| 4 | Yes | Yes | Yes | No |
| 5 | Yes | No | No | Yes |
| 6 | Yes | No | Yes | No |

Features disclosed according to the device are also deemed to be disclosed as according to the method and vice versa.

Further advantages, features and details of the invention emerge from the following description of preferred examples of embodiment and with the aid of the drawings.

BRIEF DESCRIPTION OF THE DRAWINGS

Identical components and components with the same function are marked with the same reference numbers in the figures.

DETAILED DESCRIPTION OF THE INVENTION

Figure 1A:
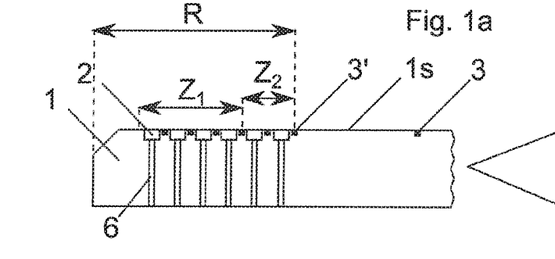
FIG. 1a shows a diagrammatic partial view (not true to scale) of a first embodiment of a holding device according to the invention.

FIG. 1a shows a diagrammatic partial view (not true to scale) of a cross-section of a first embodiment of a holding device 1 according to the invention (referred to alternatively as a substrate holder), wherein only an edge region R with fixing elements 2 (fixing means) is represented.

Holding device 1 comprises a plurality of zones Zi, which are preferably located in edge region R. Each of zones Zi can comprise a plurality of fixing elements 2. By way of example, two zones Z1 and Z2 are represented in FIG. 1a. Four fixing elements 2 are shown in cross-section in first zone Z1, whereas two fixing elements 2 are shown in second zone Z2. In particular, the zones Zi can be limited to edge region R of substrate holder 1 or distributed over entire substrate holder 1.

Fixing elements 2 are used for the fixing of a substrate holding surface 4a of a first, in particular upper, substrate 1o or a second, in particular lower, substrate 1u.

A plurality of sensors 3, 3', in particular distance sensors, are preferably located in holding surface 1s. The sensors are used for the measurement of physical and/or chemical properties between fixed substrate 4 and holding surface 1s. Sensors 3, 3' are in particular distance sensors, with the aid of which a distance between holding surface 1s and substrate holding surface 4a is measured.

Substrate holder 1 is preferably designed such that a curvature element 5, 5' (curvature means) is located in its centre C (see FIGS. 1e and 1f), with the aid of which a substrate 4o, 4u fixed to substrate holder 1 can be curved. Particularly preferably, curvature element 5 is a fluid outlet opening, via which a gas, in particular compressed air, can be pumped between substrate holder 1 and substrate 4. Substrate 4 is curved by the excess pressure, while at the same time it is fixed by fixing elements 2 or released in a controlled manner.

Figure 1B:
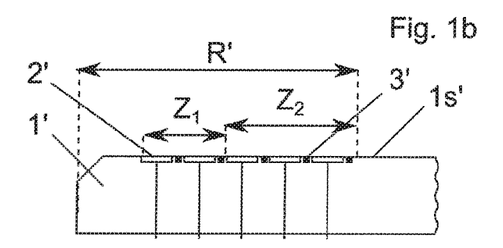
FIG. 1b shows a diagrammatic partial view (not true to scale) of a second embodiment of the holding device according to the invention.
Figure 1C:
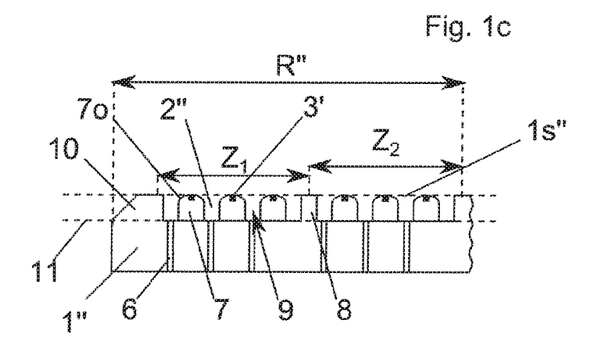
FIG. 1c shows a diagrammatic partial view (not true to scale) of a third embodiment of the holding device according to the invention.
Figure 1D:
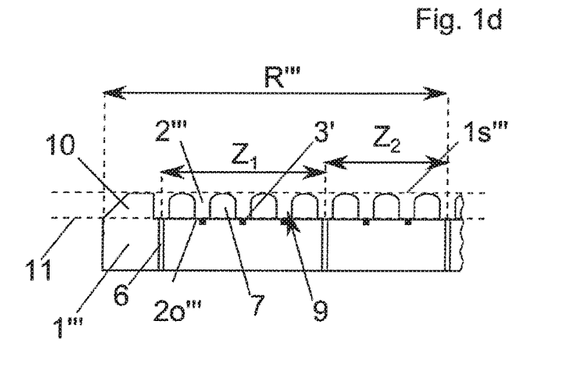
FIG. 1d shows a diagrammatic partial view (not true to scale) of a fourth embodiment of the holding device according to the invention.
Figure 1E:
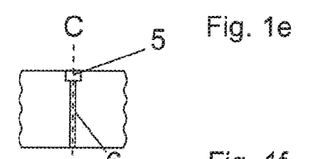
FIG. 1e shows a diagrammatic partial view (not true to scale) of a first embodiment of a curvature (changing) means of the holding device according to the invention.
Figure 1F:
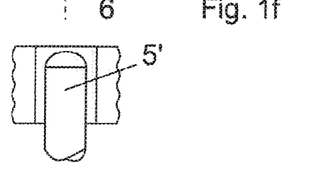
FIG. 1f shows a diagrammatic partial view (not true to scale) of a second embodiment of a curvature (changing) means of the holding device according to the invention.

In the alternative embodiment according to the invention according to FIG. 1f, curvature element 5' is a pin, which extends through holding device 1 and which is constituted displaceable normal to the latter (curvature means or curvature changing means).

The embodiments in respect of FIGS. 1e and 1f similarly apply to the embodiments according to FIGS. 1a to 1d.

A substrate holder 1' in a second embodiment according to the invention is shown in FIG. 1b. Substrate holder 1' comprises a plurality of zones Zi which are preferably located in edge region R. Each of zones Zi can in general comprise a plurality of fixing elements 2'. Fixing elements 2' are electrodes of an electrostatic fixing. Two zones Z1 and Z2 are represented by way of example in FIG. 1b. In first zone Z1, two fixing elements 2' can be seen in cross-section, whilst in second zone Z2 three fixing elements 2' can be seen in cross-section. In particular, zones Zi can be limited to the outer edge of substrate holder 1', or can be distributed over entire substrate holder 1'.

A plurality of sensors 3, 3', in particular distance sensors, are preferably located in holding surface 1s'. Sensors 3, 3' are used for the measurement of physical and/or chemical properties between fixed substrate 4 and holding surface 1s'. Sensors 3, 3' are in particular distance sensors, with the aid of which the distance between holding service 1s' and substrate holding surface 4a is measured.

A substrate holder 1" in a third embodiment according to the invention is disclosed in FIG. 1c. Substrate holder 1" comprises a plurality of zones Zi, which are preferably located solely in edge region R. Each of zones Zi can in particular comprise a plurality of fixing elements 2".

Fixing elements 2" are spatial regions 9 between substrate holding surface 1a, adjacent webs 8 or an edge element 10 and webs 8 and a bottom penetrated by lines 6. A pressure is adjusted in lines 6 in order to engage substrate 4o, 4u by suction and thus to fix the latter.

A plurality of studs 7, on which substrate 4o, 4u lies, are in particular located in spatial region 9. Studs 7 are used in particular to prevent excessive contamination. Studs 7 have been represented above average size in FIG. 1c in order to improve the view. In reality, studs 7 are much smaller compared to the thickness of substrate holder 1".

Two zones Z1 and Z2 are represented by way of example in FIG. 1c. Three fixing elements 2" can be seen in cross-section in the first zone Z1, whilst three fixing elements 2" can likewise be seen in cross-section in second zone Z2. In particular, zones Zi can be limited to the outer edge of substrate holder 1" or be distributed over entire substrate holder 1".

A plurality of sensors 3, 3', in particular distance sensors, are preferably located in studs 7, in particular at a stud surface 7o of studs 7 that contacts substrate holding surface 1a in the non-curved state. The sensors are used to measure physical and/or chemical properties between fixed substrate 4 and holding surface 1s defined by stud surface 7o and peripheral edge element 10. Sensors 3, 3' are in particular distance sensors, with the aid of which the distance between stud surface 7o and substrate surface 4o is measured.

FIG. 1d shows a substrate holder 1'" in a fourth embodiment according to the invention. Substrate holder 1'" comprises in particular a plurality of zones Zi which are preferably located in edge region R. Each of zones Zi can comprise a plurality of fixing elements 2'".

Fixing elements 2'" are spatial regions 9 between two adjacent lines 6, in which a pressure can be adjusted. A limitation of spatial regions 9 takes place only at the periphery of holding device 1'" by a circumferential edge element 10, on which substrate 1o, 1u lies at the circumference and which together with stud surface 7o defines a holding surface 1s".

A plurality of studs 7 is located in particular in spatial region 9, on stud surface 7o whereof a substrate 4o, 4u can be held. Studs 7 are used in particular to prevent excessive contamination. Studs 7 have been represented above average size in FIG. 1c in order to improve the view. In reality, the studs are much smaller compared to the thickness of substrate holder 1'".

Two zones Z1 and Z2 are represented by way of example in FIG. 1d. A fixing element 2'" can be seen in cross-section in first zone Z1, a fixing element 2'" likewise being been present in cross-section in second zone Z2. In particular, zones Zi can be limited to the outer edge of substrate holder 1'" or can be distributed over entire substrate holder 1'".

A plurality of sensors 3, 3', in particular distance sensors, is preferably located on a bottom of spatial regions 9 between studs 7. Sensors 3, 3' are used to measure physical and/or chemical properties between fixed substrate 4 and the bottom. Sensors 3, 3' are in particular distance sensors, with the aid of which the distance between the bottom and substrate holding surface 4a is measured. The distance of substrate holding surface 1a from stud surface 7o can be calculated therefrom via the known height of studs 7.

Figures 2A, 2B:
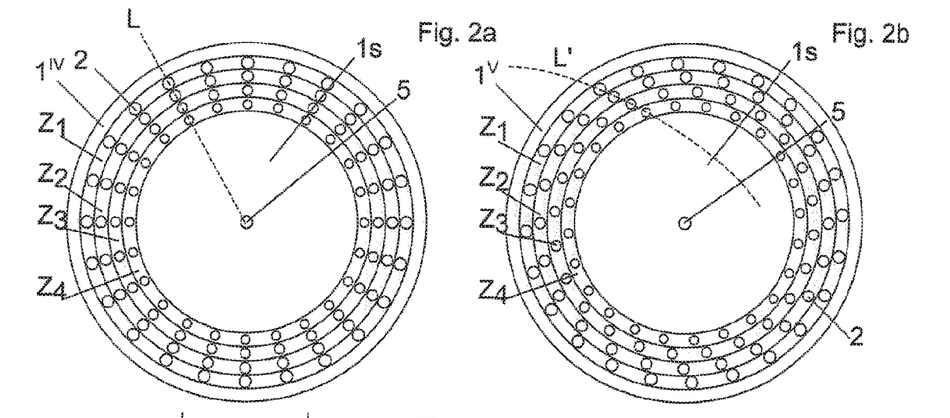
FIG. 2a shows a diagrammatic view (not true to scale) of a fifth embodiment of a holding device according to the invention.
FIG. 2b shows a diagrammatic view (not true to scale) of a sixth embodiment of a holding device according to the invention.

FIG. 2a shows a holding device $1^{IV}$, wherein fixing elements 2 are arranged in four concentric zones Z1-Z4. A curvature element 5, 5' is located at centre C of holding device $1^{IV}$ (see FIG. 1e or 1f). Corresponding fixing elements 2 of a plurality of zones are each arranged along radially running lines L.

FIG. 2b shows a holding device $1^V$, wherein fixing elements 2 are arranged in zones Z1-Z4. A curvature element 5, 5' is located in the centre of holding device $1^V$ (see FIG. 1e or 1f). Corresponding fixing elements 2 of a plurality of zones are each arranged along a line L', which does not run through curvature element 5, in particular not through centre C. In particular, line L' does not have to be a straight line. Corresponding fixing elements 2 lying opposite in each case are arranged point-mirrored with respect to centre C.

Figure 2C:
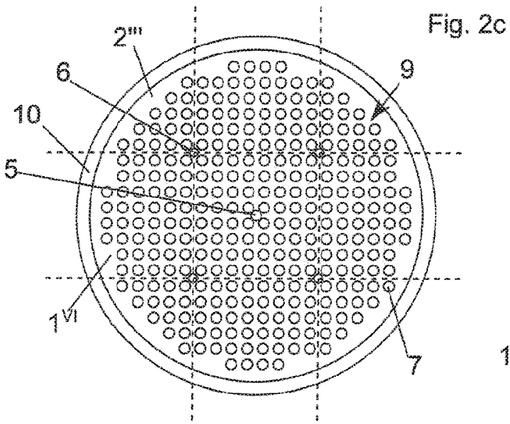
FIG. 2c shows a diagrammatic view (not true to scale) of a seventh embodiment of a holding device according to the invention.

FIG. 2c shows a holding device $1^{VI}$ with a plurality of studs 7, surrounded by an edge element 10 similar to the embodiment according to FIG. 1c. Spatial regions 9 are located between studs 7, said spatial regions acting as fixing elements $2^{IV}$ during an evacuation. The evacuation takes place via lines 6. Since no webs 8, which separate spatial regions 9 from one another, are present in this embodiment according to the invention, a fluid introduced via a curvature element 5 (see FIG. 1e) is removed again by suction directly via channels 6. This embodiment according to the invention is therefore an example of a substrate holder, wherein a stationary laminar flow is built up between substrate holder $1^{VI}$ and substrate 4o, 4u.

Figure 2D:
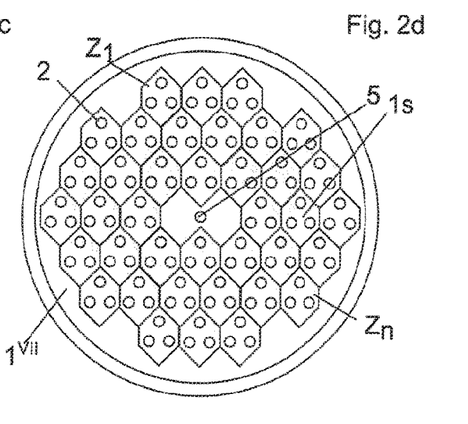
FIG. 2d shows a diagrammatic view (not true to scale) of an eighth embodiment of a holding device according to the invention.

FIG. 2d shows an embodiment according to the invention, wherein a plurality of zones Z are provided in each case with three fixing elements 2. Zones Z are constituted as hexagons and at least predominantly occupy the holding surface. Centre Z and the peripheral edge are not occupied.

Figure 2E:
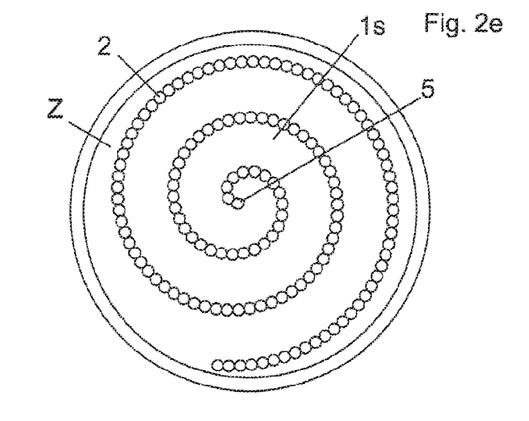
FIG. 2e shows a diagrammatic view (not true to scale) of a ninth embodiment of a holding device according to the invention.
Figures 3A, 3B, 3C:
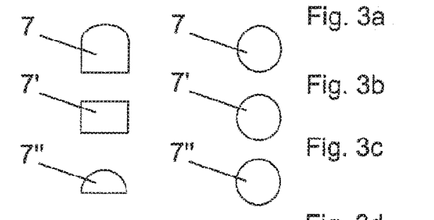
FIG. 3a-3e show a diagrammatic side view (not true to scale) and a plan view of embodiments of an elevation according to the invention.
Figures 3D, 3E:
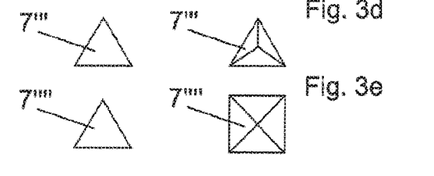

FIG. 2e shows an embodiment according to the invention, wherein fixing elements 2 are arranged along a spiral. In this case, entire holding surface 1s represents the sole zone Z. The individual or grouped control of the fixing elements is conceivable. Curvature element 5, 5' is arranged at the end of the spiral and in centre C.

All the embodiments according to FIGS. 2a-2e are holding devices wherein the fixings are constituted as underpressure or vacuum fixings. Corresponding substrate holders with electrostatic fixing can similarly be implemented. For the sake of a clearer view, sensors 3, 3' are not represented, but can be constituted corresponding to the embodiments according to FIGS. 1a to 1d.

FIGS. 3a-3e show examples of embodiment of shapes of elevations 7, 7', 7'', 7''', 7''''. The shape according to FIG. 3a comprises a cylindrical base body with a round head. The shape according to FIG. 3b comprises a cylindrical base body with a flat head. The shape according to FIG. 3c comprises a hemispherical base body. The shape according to FIG. 3d comprises a three-sided pyramid. The shape according to FIG. 3e comprises a four-sided pyramid.

Figure 4A:
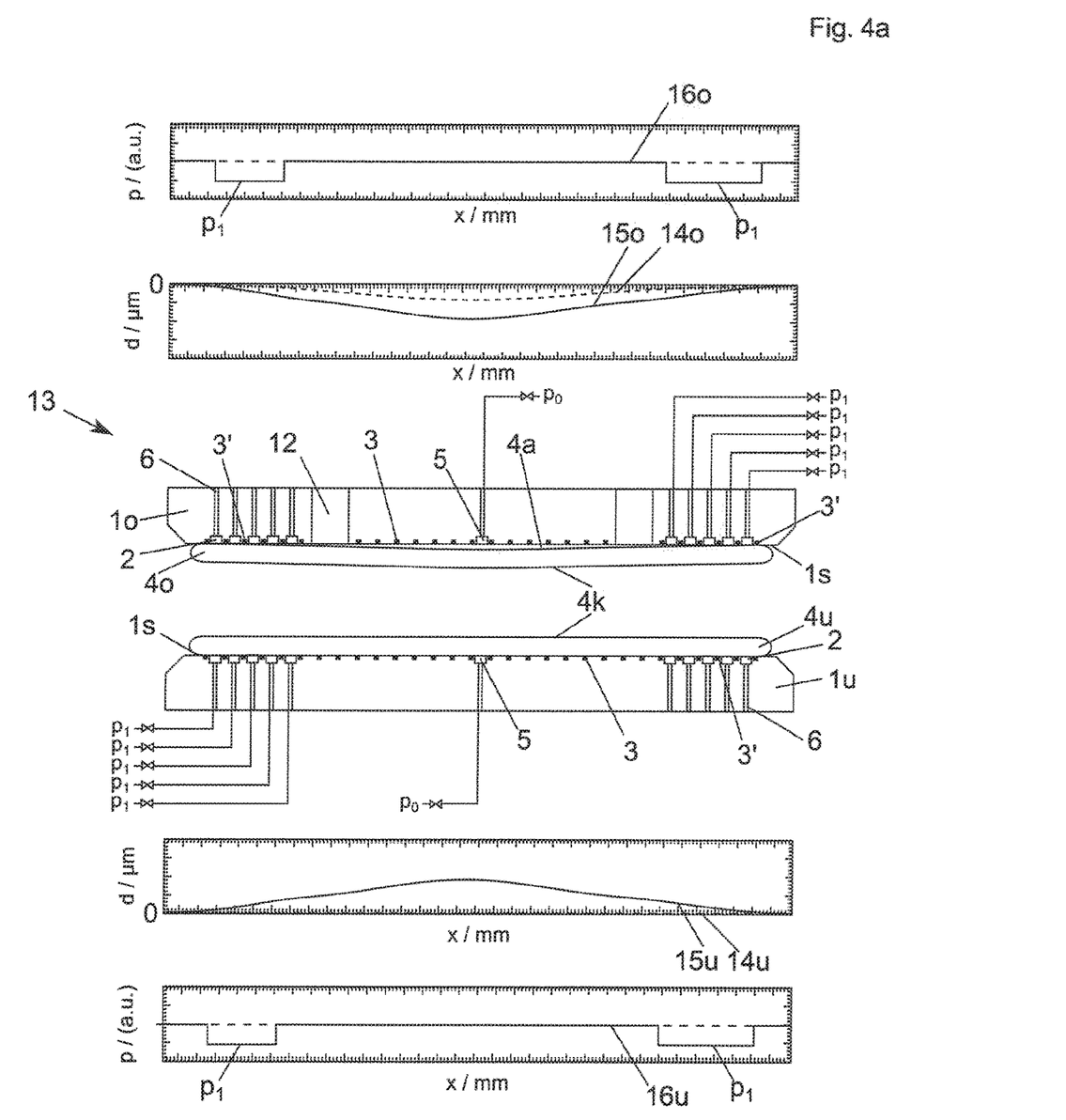
FIG. 4a shows a diagrammatic cross-sectional view (not true to scale) of an embodiment of a bonder according to the invention with pressure and distance diagrams in a first process step of a process according to the invention.

FIG. 4a shows a bonder 13 according to the invention for the contacting and bonding of contact faces 4K of a first/upper substrate 4o and a second/lower substrate 4u arranged opposite one another. Bonder 13 comprises a lower substrate holder 1u and an upper substrate holder 1o. Substrate holders 1u, 1o can in particular be constituted as above-described holding devices 1, 1', 1'', 1''', $1^{IV}$, $1^V$, $1^{VI}$ for holding a first/upper substrate 4o and a second/lower substrate 4u, wherein lower substrate holder 1u can be constituted or equipped differently from upper substrate holder 1o. Upper substrate holder 1o preferably comprises measurement holes 12, through which a measurement of substrate 4o can take place from a rear side of substrate holder 1o. Alternatively, sensors can be arranged in the measurement holes. Measurement holes 12 are arranged in particular between the curvature changing means and the fixing means. Alternatively or in addition, lower substrate holder 1u can comprise corresponding measurement holes 12. The measurement holes penetrate holding device 1 and run in particular orthogonal to holding surface 1s. Measurement holes 12 are arranged in particular at the same distance from the centre of holding surface 1s. Measurement holes 12 are preferably arranged at a distance of 180° or 120° from one another.

Substrate holders 1u, 1o comprise a holding surface 1s, with a plurality of fixing elements 2 and sensors 3, 3'. Fixing elements 2 are evacuated via lines 6 and fix substrates 4u, 4o. Diagrams are shown above and below substrate holders 1u, 1o, which diagrams show in each case distances d between sensors 3 constituted as distance sensors and substrate 4u, 4o along the x-direction (substrate diameter) for the given x-positions. The distance sensors are arranged distributed directly at curvature changing means 5 up to the fixing means. They thus extend over a partial area of holding surface 1s.

Sensors 3' constituted as pressure sensors are arranged in the region of the fixing means, with which sensors pressures $p_1$ are measured along the x-position of sensors 3' between substrates 4u, 4o and substrate holders 1u, 1o.

Desired setpoint curvatures 15u, 15o, in particular set by means of software, as well as actual curvatures 14u, 14o measured by the distance sensors are entered in the distance diagrams. Upper substrate 4o has an actual curvature 14o, in particular present due to gravitation, while lower substrate 1u lies flat and therefore, in the sense of the present invention, does not have an actual curvature 14u (in reality, a vanishingly small curvature). It is however also conceivable that actual curvature 14o caused by gravitation is negligibly small. Both desired curvatures 15u, 15o are mirror-symmetrical in the stated example. Arbitrarily curvatures 15u, 15o can be specified. Pressure courses 16u and 16o show a pressure drop in the region of activated fixing elements 2. This shows that the fixing of substrates 4u, 4o is activated.

A process step of the alignment of substrates 1u, 1o with respect to one another is not represented.

Figure 4B:
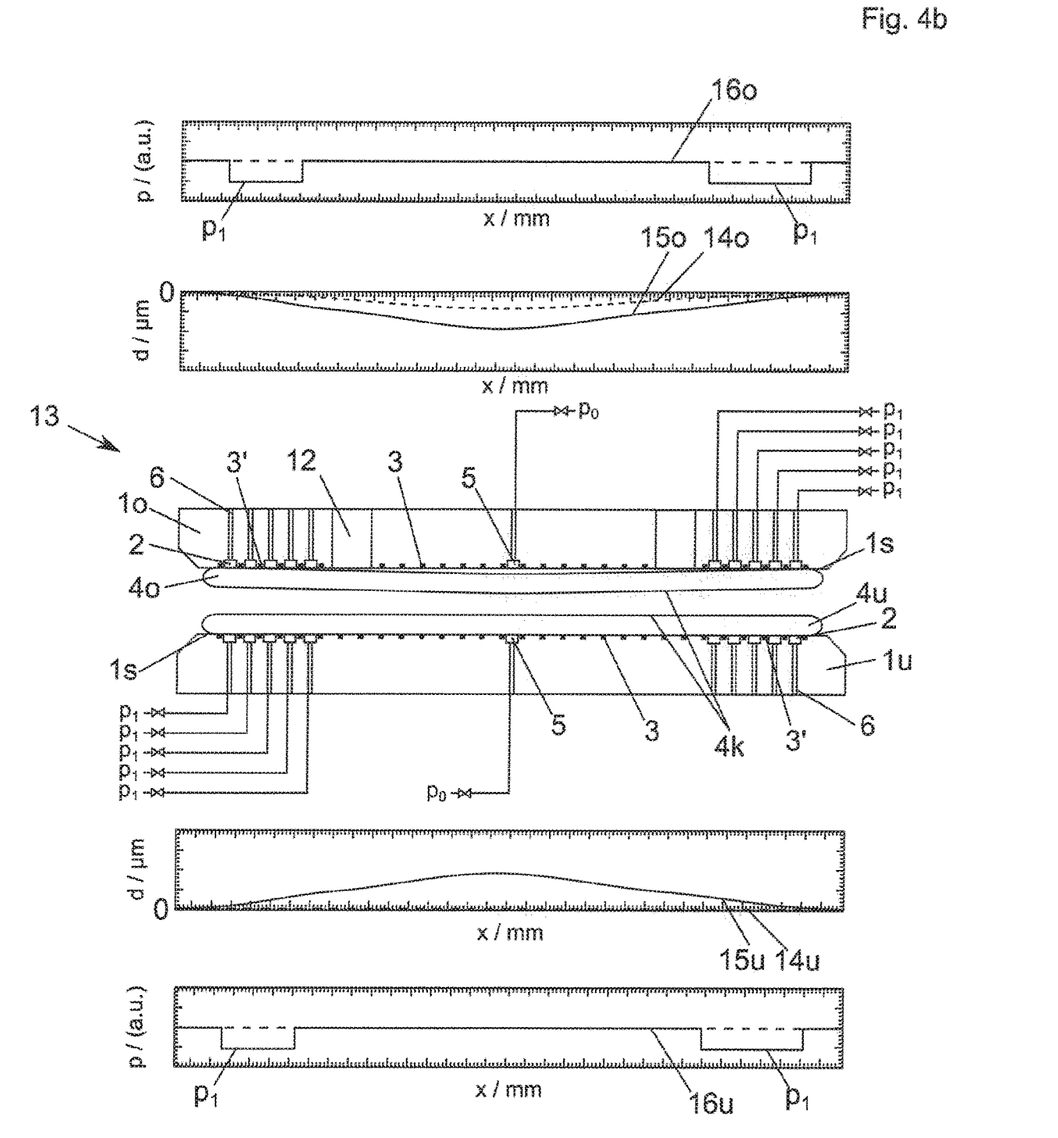
FIG. 4b shows a diagrammatic cross-sectional view (not true to scale) of the embodiment according to FIG. 4a in a further process step.

FIG. 4b shows bonder 13 in a further process step. The two substrate 4u and 4o have been brought closer together by a relative movement of the two substrate holders 1u, 1o. Otherwise nothing has changed compared to the situation according to FIG. 4a.

Figure 4C:
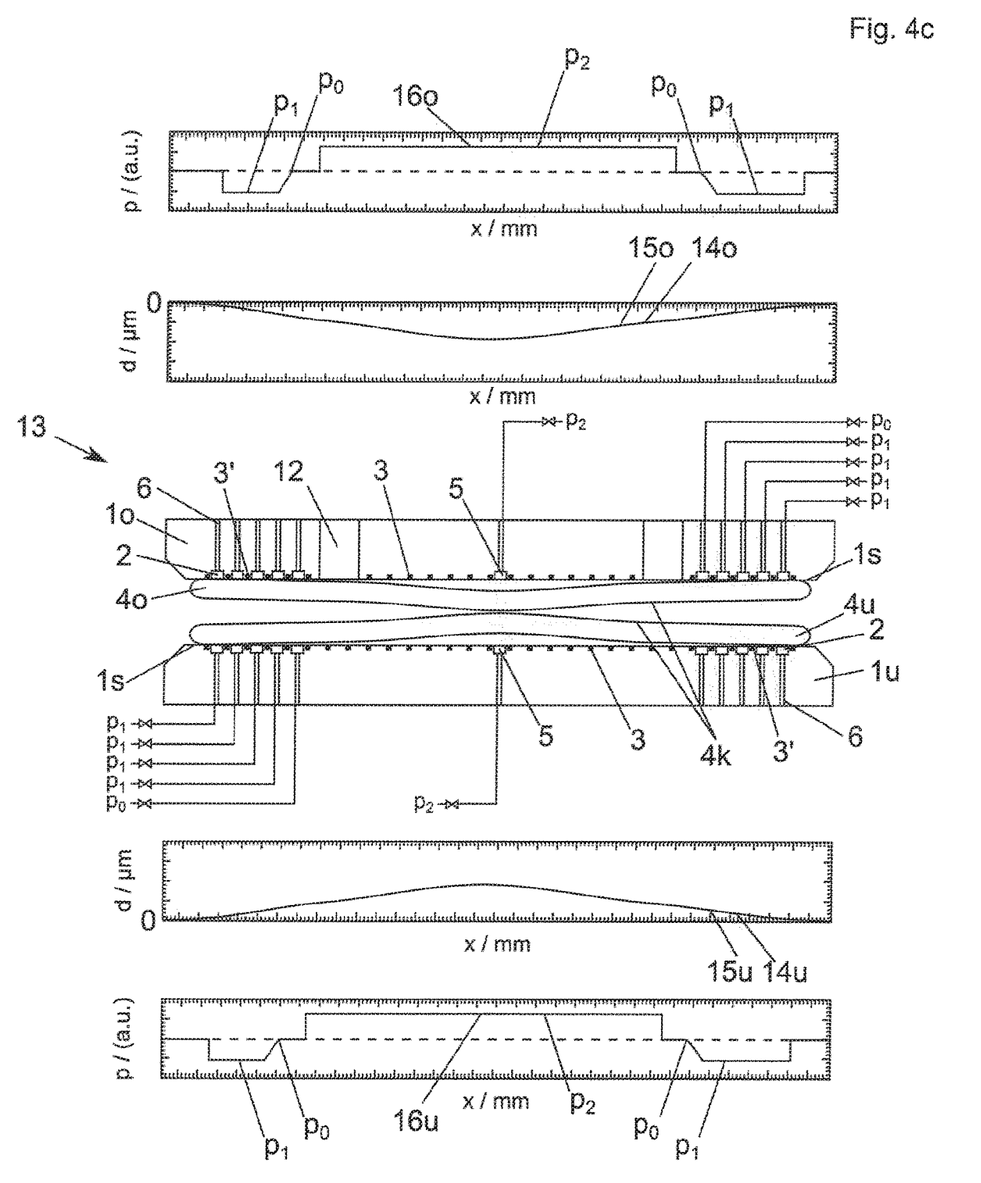
FIG. 4c shows a diagrammatic cross-sectional view (not true to scale) of the embodiment according to FIG. 4a in a further process step.

FIG. 4c shows bonder 13 in a further process step. The two substrate 1u, 1o are brought into the setpoint curvature by the use of curvature elements 5, in the case shown a gas outlet opening, through which a gas flows with a pressure p2, wherein a control of the pressure preferably takes place by means of the distance sensors. The pressures of fixing elements 2 can also be used for the control/regulation, so that the latter also take over the tasks of curvature means 5, 5 or curvature changing means 5, 5 and, within the meaning of the invention, can thus also be included in the latter.

In the example shown, one of fixing elements 2'' is reset for this purpose from pressure p1 to pressure p0 to achieve the desired curvature before contacting of substrates 4o, 4u.

For the sake of simplicity, only three pressure values p0, p1 and p2 are shown in the shown representations. The pressure values can be controlled/regulated in particular continuously and/or constantly.

Figure 4D:
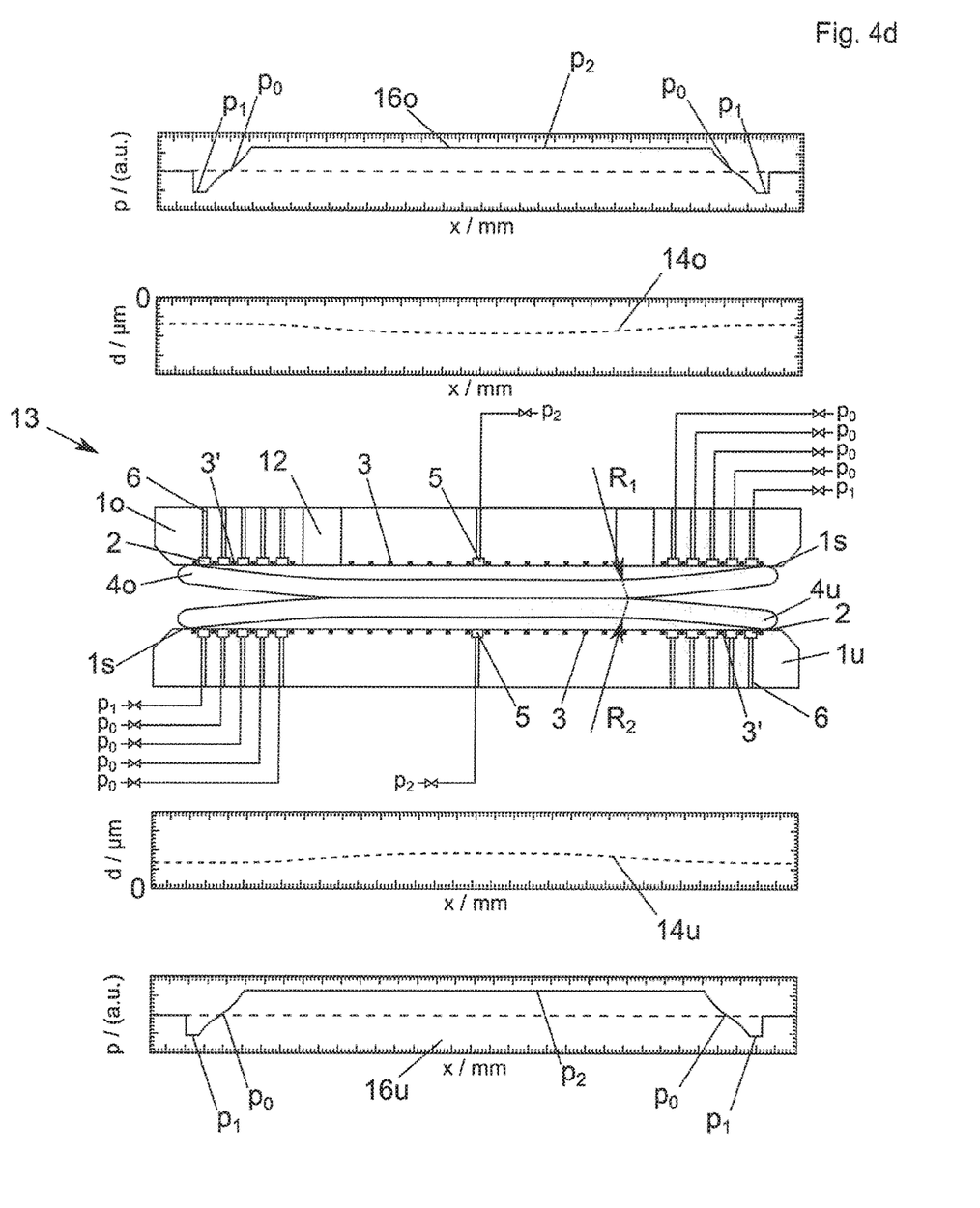
FIG. 4d shows a diagrammatic cross-sectional view (not true to scale) of the embodiment according to FIG. 4a in a further process step and FIG. 4e shows a diagrammatic cross-sectional view (not true to scale) of the embodiment according to FIG. 4a in a further process step.
Figure 4E:
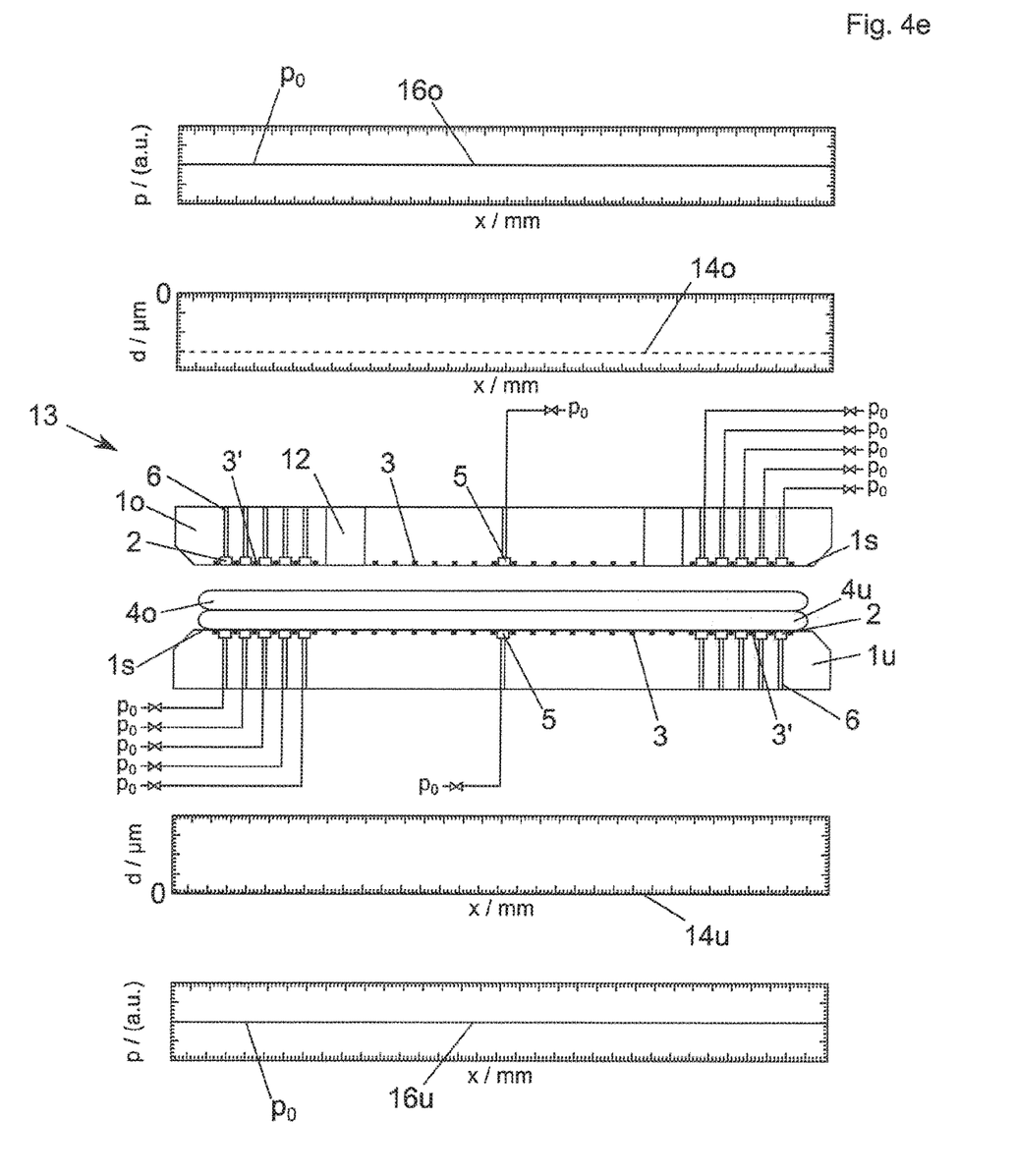

FIG. 4d shows bonder 13 in a further process step. The two substrates 4u, 4o, as a result of the mutual approach of substrates 4u, 4o, form a bonding wave which propagates radially outwards, wherein the curvature of substrates 4u, 4o changes continuously (curvatures changing means). The change in curvature of lower substrate 1u and of upper substrate 1o is continuously monitored by means of the distance sensors and, if need be, corrected by curvature element 5 and/or fixing elements 2, in such a way that the setpoint curvature desired or set in each case is achieved (curvature changing means). Curvature radii R1 of upper substrate 4o and R2 of lower substrate 4u represent important parameters at the point of the bonding wave.

The pressures of four inner peripheral rows of fixing elements 2 are simultaneously reduced to p0 in the case of upper holding device 1o and lower holding device 1u. Substrates 1u, 1o thus lose the fixing to holding surface 1o, in particular continuously from inside outwards, as a result whereof pressure p2 from curvature element 5 can spread further.

As a result of the fact that the control takes account of the curvatures and changes in curvature of the substrates, run-out errors are minimised.

FIG. 4 shows bonder 13 in a further process step. The two substrates 1u, 1o have been bonded together in a controlled manner, whereby the pressure of the outermost row of fixing elements 2 of upper holding device 1o has been reduced to p0.

REFERENCE LIST 1, 1' 1", 1''' holding device/substrate holder
$1^{IV}$, $1^{V}$, $1^{VI}$ holding device/substrate holder
1o first holding device/upper substrate holder
1u second holding device/lower substrate holder
1s, 1s', 1s", 1s''' holding surface
2, 2', 2", 2''' fixing elements
2o''' fixing element surface
3, 3' sensors
4o first/upper substrate
4u second/lower substrate
4a substrate holding surface
5, 5' curvature element
line
7, 7', 7", 7''', 7'''' elevations/studs
7o stud surface
8 web
9 spatial region
10 edge element
11 stud plane
12 measurement holes
13 bonder
14u, 14o actual curvature
15u, 15o setpoint curvature
16u, 16o pressure course
L, L' line
x position
d distance
p pressure
R1, R2 radius of curvature Having described the invention, the following is claimed:

1. A method for bonding substrates comprising:
providing a first substrate having a contact face and a second substrate having a contact face;
holding the first substrate to a first holding surface of a first holding device having a first plurality of fixing elements arranged radially symmetrically on the first holding surface, wherein a first plurality of radially-arranged independently-controllable holding zones are defined by sub-groups of the first plurality of fixing elements;
holding the second substrate to a second holding surface of a second holding device having a second plurality of fixing elements arranged radially symmetrically on the second holding surface, wherein a second plurality of radially-arranged independently-controllable holding zones are defined by sub-groups of the second plurality of fixing elements, wherein the contact face of the first substrate faces the contact face of the second substrate;
contacting the contact face of the first substrate with the contact face of the second substrate, wherein the contact faces of the first and/or second substrates have a respective curvature before the contacting of the contact faces of the first and second substrates;
bonding the first substrate with the second substrate at the contact faces of the first and second substrates; and
controlling during the bonding a change in the curvature of the contact face of the first substrate and/or controlling a change in the curvature of the contact face of the second substrate, wherein one of the first and second holding surfaces is formed from a plurality of studs, wherein another of the first and second holding surfaces does not comprise a peripheral edge element and/or wherein the plurality of studs are the only studs on the one of the first and second holding surfaces,
wherein controlling further includes reducing, after the contact face of the first substrate contacts the contact face of the second substrate, a force of fixing elements of a holding zone of the first or second plurality of holding zones that is disposed in an inner area of the respective first or second holding surface prior to reducing a force of fixing elements of another holding zone of the respective first or second plurality of holding zones that is disposed in an outer area of the respective first or second holding surface.

2. The method according to claim 1, wherein the curvatures of the contact faces and/or the changes in the curvatures of the contact faces are adjusted and/or controlled mirror-symmetrically and/or concentrically with respect to the contact faces before the contacting of the contact faces of the first and second substrates.

3. The method according to claim 1, wherein at least one of the curvatures of the contact faces and/or the changes in the curvatures of the contact faces is provided by curvature means.

4. The method according to claim 3, wherein the curvature means comprises a pin.

5. The method according to claim 1, wherein at least one of the curvatures of the contact faces and/or changes in the curvatures of the contact faces is adjusted and/or controlled by fluid pressurisation by means of a fluid acting directly on the first and/or second substrate.

6. The method according to claim 1, wherein the first substrate and/or the second substrate are fixed by fixing means arranged in a ring-shaped manner, at the periphery of the first and second holding surfaces solely in the region of side edges of the first and second substrates.

7. The method according to claim 6, wherein the fixing means is arranged in a circular ring-shaped manner.

8. The method according to claim 6, wherein the fixing means comprise separately controllable, fixing elements divided up into zones at the first and second holding surfaces.

9. The method according to claim 8, wherein the fixing elements are arranged concentrically.

10. The method according to claim 8, wherein the fixing elements are distributed uniformly in the zones.

11. The method according to claim 1, wherein said plurality of studs of the first holding surface and/or the second holding surface form a first holding plane of the first holding surface and a second holding plane of the second holding surface.

12. The method according to claim 1, wherein the curvatures of the contact faces and/or change in the curvatures of the contact faces is detected by use of curvature measure means arranged along the first and/or second holding surfaces.

13. The method according to claim 12, wherein the curvature measure means comprises sensors.

14. The method according to claim 13, wherein said sensors are distance sensors.

15. The method according to claim 1, wherein said curvatures of the contact faces of the first and second substrates before the contacting of the contact faces is in a range of a 0 to 100 μm deviation from a plane state.

16. The method according to claim 1, wherein at least one of the first holding device or the second holding device comprises a plurality of vacuum ports for holding a substrate along a first plane defined by the respective holding surface, the plurality of vacuum ports opening on a second plane spaced apart from the first plane, and the plurality of studs of the respective holding surface extend between the first plane and the second plane.

17. A device for bonding a first substrate with a second substrate at mutually facing contact faces of the first and second substrates, said device comprising:
- a first holding device for holding the first substrate to a first holding surface, the first holding device including a first plurality of fixing elements arranged radially symmetrically on the first holding surface, wherein a first plurality of radially-arranged independently-controllable holding zones are defined by sub-groups of the first plurality of fixing elements;
- a second holding device for holding the second substrate to a second holding surface, the second holding device including a second plurality of fixing elements arranged radially symmetrically on the second holding surface, wherein a second plurality of radially-arranged independently-controllable holding zones are defined by sub-groups of the second plurality of fixing elements;
- curvature means for providing a respective curvature of the contact faces of the first and/or second substrates before contacting of the contact faces;
- curvature changing means for changing the curvature of the contact face of the first substrate and/or for changing the curvature of the contact face of the second substrate, said curvature changing means controlling the change of curvature of the contact face of the first substrate and/or the contact face of the second substrate during bonding of the first substrate with the second substrate, wherein at least one of the first and second holding surfaces is formed from plurality of studs, wherein another of the first and second holding surfaces does not comprise a peripheral edge element and/or wherein the plurality of studs are the only studs on the one of the first and second holding surfaces,
- wherein the curvature changing means is configured to reduce, after the contact face of the first substrate contacts the contact face of the second substrate, a force of fixing elements of a holding zone of the first or second plurality of holding zones that is disposed in an inner area of the first or second holding surface prior to reducing a force of fixing elements of another holding zone of the respective first or second plurality of holding zones that is disposed in an outer area of the respective first or second holding surface.

18. The device according to claim 17, wherein the first holding device and/or the second holding device comprise mechanical curvature means and/or fluid pressurisation means for the adjustment and/or control of the curvatures of the contact faces of the first and second substrates and/or changes in the curvatures of the contact faces of the first and/or second substrates.

19. The device according to claim 17, wherein the first holding device and/or the second holding device comprise fixing means arranged in a ring-shaped manner, at the periphery of the first and second holding surfaces solely in the region of side edges of the first and second substrates.

20. The device according to claim 19, wherein the fixing means is arranged in a circular ring-shaped manner.

21. The device according to claim 19, wherein the fixing means comprise separately controllable fixing elements divided up into zones at the first and second holding surfaces.

22. The device according to claim 17, wherein said plurality of studs of the first holding surface and/or the second holding surface form a first holding plane of the first holding surface and a second holding plane of the second holding surface.

23. The device according to claim 17, wherein the device further comprises curvature measure means for detecting the curvatures of the contact surfaces of the first and second substrates and/or change in the curvatures of the contact surfaces of the first and second substrates, said curvature measure means arranged along the first and/or second holding surfaces.

24. The device according to claim 23, wherein the curvature measure means comprises sensors.

25. The device according to claim 24, wherein the sensors are distance sensors.

26. The device according to claim 17, wherein said curvatures of the contact faces of the first and second substrates before the contacting of the contact faces is in a range of a 0 to 100 μm deviation from a plane state.

27. The device according to claim 17, wherein at least one of the first holding device or the second holding device comprises a plurality of vacuum ports for holding a substrate along a first plane defined by the respective holding surface, the plurality of vacuum ports opening on a second plane spaced apart from the first plane, and the plurality of studs of the respective holding surface extend between the first plane and the second plane.

* * * * *